United States Patent [19]

Yamada

[11] Patent Number: 4,571,626
[45] Date of Patent: Feb. 18, 1986

[54] SOLID STATE AREA IMAGING APPARATUS

[75] Inventor: Takahiro Yamada, Katano, Japan

[73] Assignee: Matsushita Electric Industrial Co., Ltd., Kadoma, Japan

[21] Appl. No.: 415,544

[22] Filed: Sep. 7, 1982

[30] Foreign Application Priority Data

Sep. 17, 1981 [JP] Japan .................................. 56-147671
Jan. 22, 1982 [JP] Japan .................................... 57-9313

[51] Int. Cl.⁴ .............................................. H04N 3/11
[52] U.S. Cl. .................................. 358/213; 358/212; 357/30; 357/24
[58] Field of Search ............ 357/24 LR, 30; 358/209, 358/213, 211, 212, 167, 56

[56] References Cited

U.S. PATENT DOCUMENTS

| | | | |
|---|---|---|---|
| 4,236,829 | 12/1980 | Chikamura et al. | 357/16 |
| 4,271,420 | 7/1981 | Chikamura et al. | 357/30 |
| 4,323,912 | 4/1982 | Koike et al. | 357/31 |
| 4,450,484 | 5/1984 | Terakawa et al. | 358/213 |
| 4,453,184 | 6/1984 | Hamakawa et al. | 358/213 |
| 4,454,526 | 7/1984 | Nishizawa | 357/30 |

FOREIGN PATENT DOCUMENTS

| | | | |
|---|---|---|---|
| 0027318 | 3/1978 | Japan | 358/212 |
| 0603148 | 3/1978 | U.S.S.R. | 358/211 |

Primary Examiner—Gene Z. Rubinson
Assistant Examiner—Robert Lev
Attorney, Agent, or Firm—Cushman, Darby & Cushman

[57] ABSTRACT

A solid state area imaging apparatus has a single crystalline high resistivity region formed by epitaxial growth on the surface of a semiconductor substrate, whereon opto-electro functionless parts of picture elements to accumulate (or store) signal charges, a switch means for selecting the picture elements and a signal readout means are formed. Three-dimensional opto-electro function parts are constituted by using the above-mentioned high resistivity region being connected to the picture elements.

The opto-electro function parts have a potential barrier against majority carriers of the picture element part in the high resistivity region at the vicinity of the picture element part. Opto-electronic conversions utilizing this potential barrier is performed by means of depletion mode operation of majority carriers in the picture element part.

19 Claims, 42 Drawing Figures

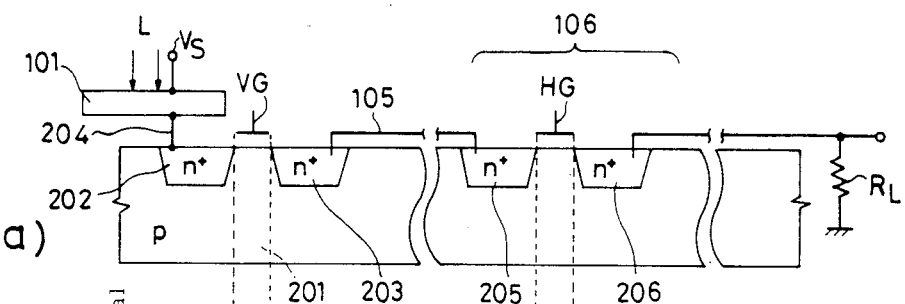
FIG. 2(a)
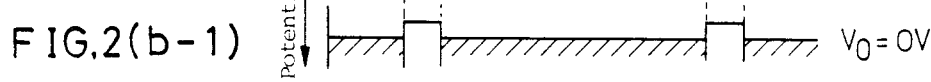
FIG. 2(b-1)
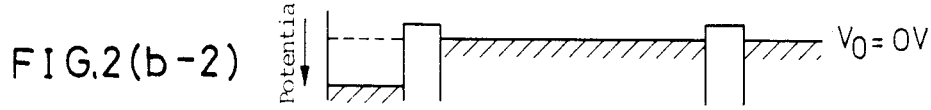
FIG. 2(b-2)
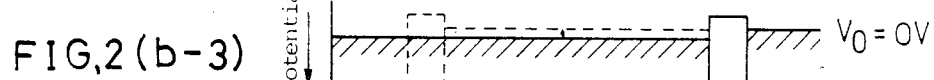
FIG. 2(b-3)
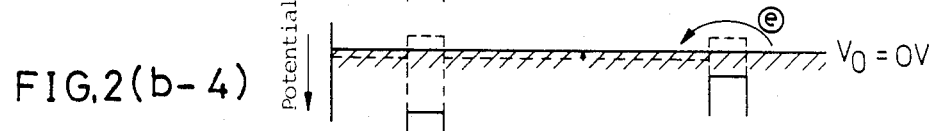
FIG. 2(b-4)
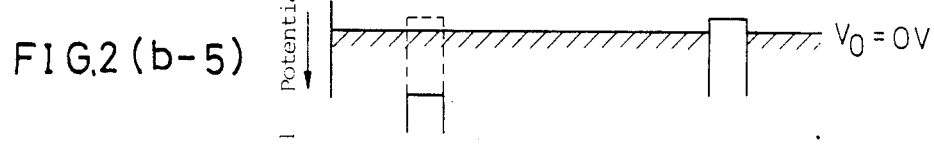
FIG. 2(b-5)
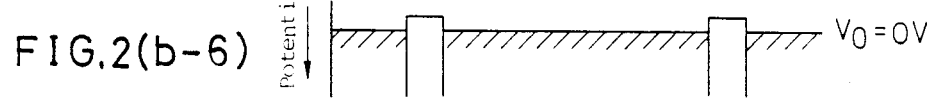
FIG. 2(b-6)
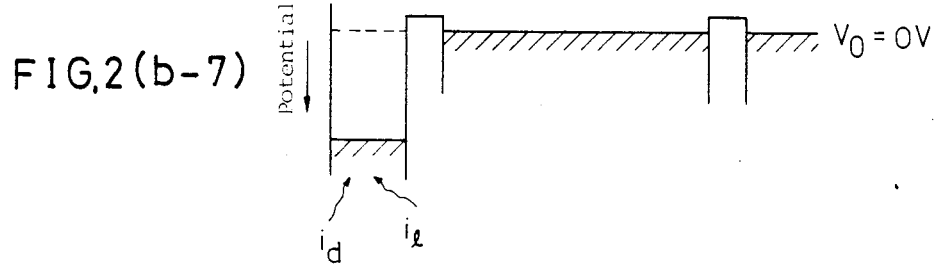
FIG. 2(b-7)

FIG 3(a)
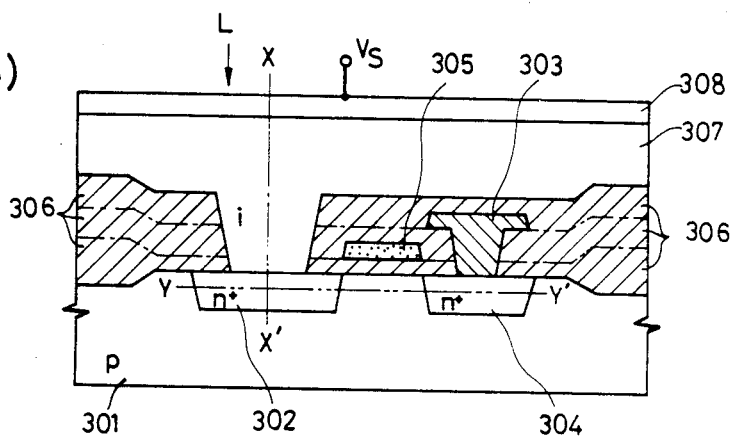
FIG 3(b)
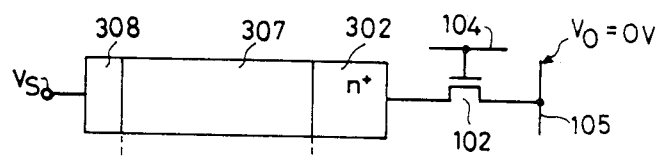
FIG 3(c)
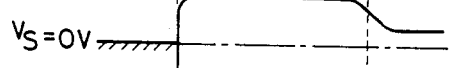
FIG 3(d)
FIG 3(e)
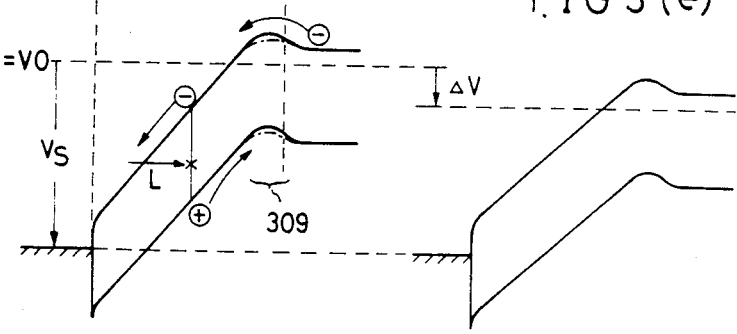

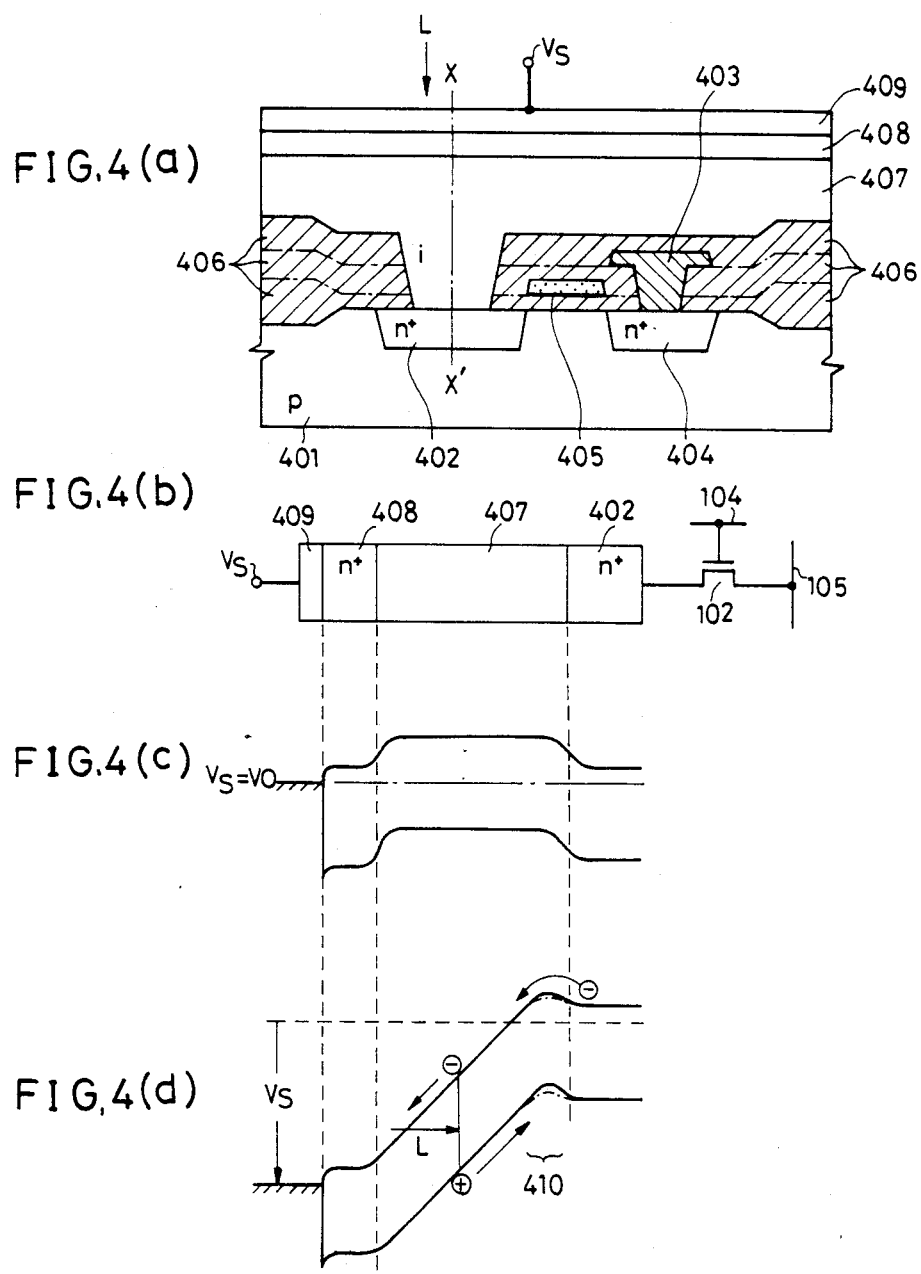

FIG 5(a)
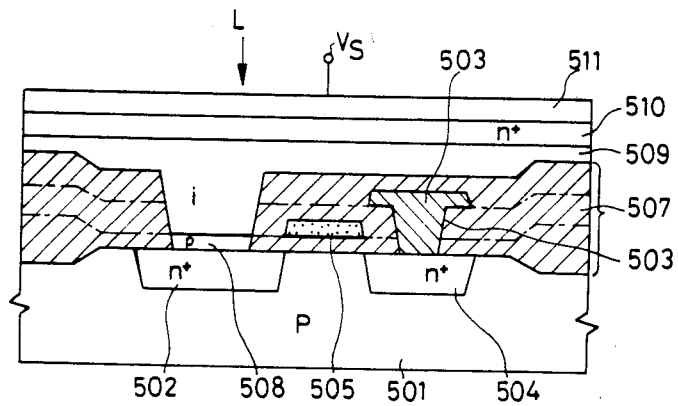
FIG 5(b)
FIG 5(b')
FIG 5(c)
FIG 5(d)
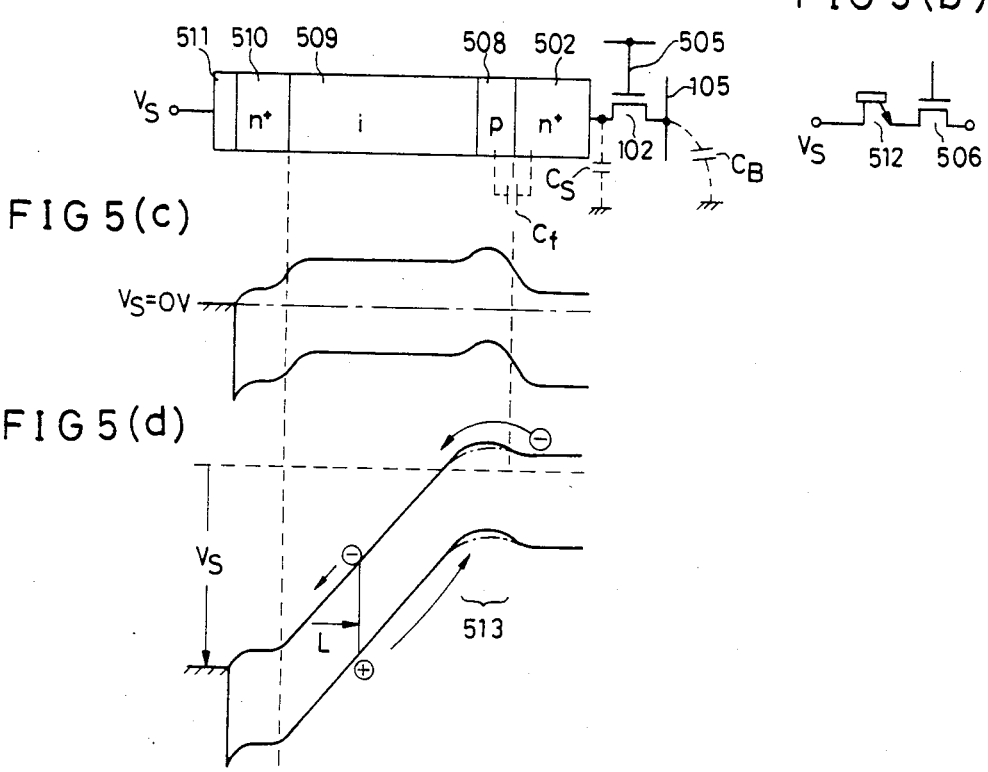

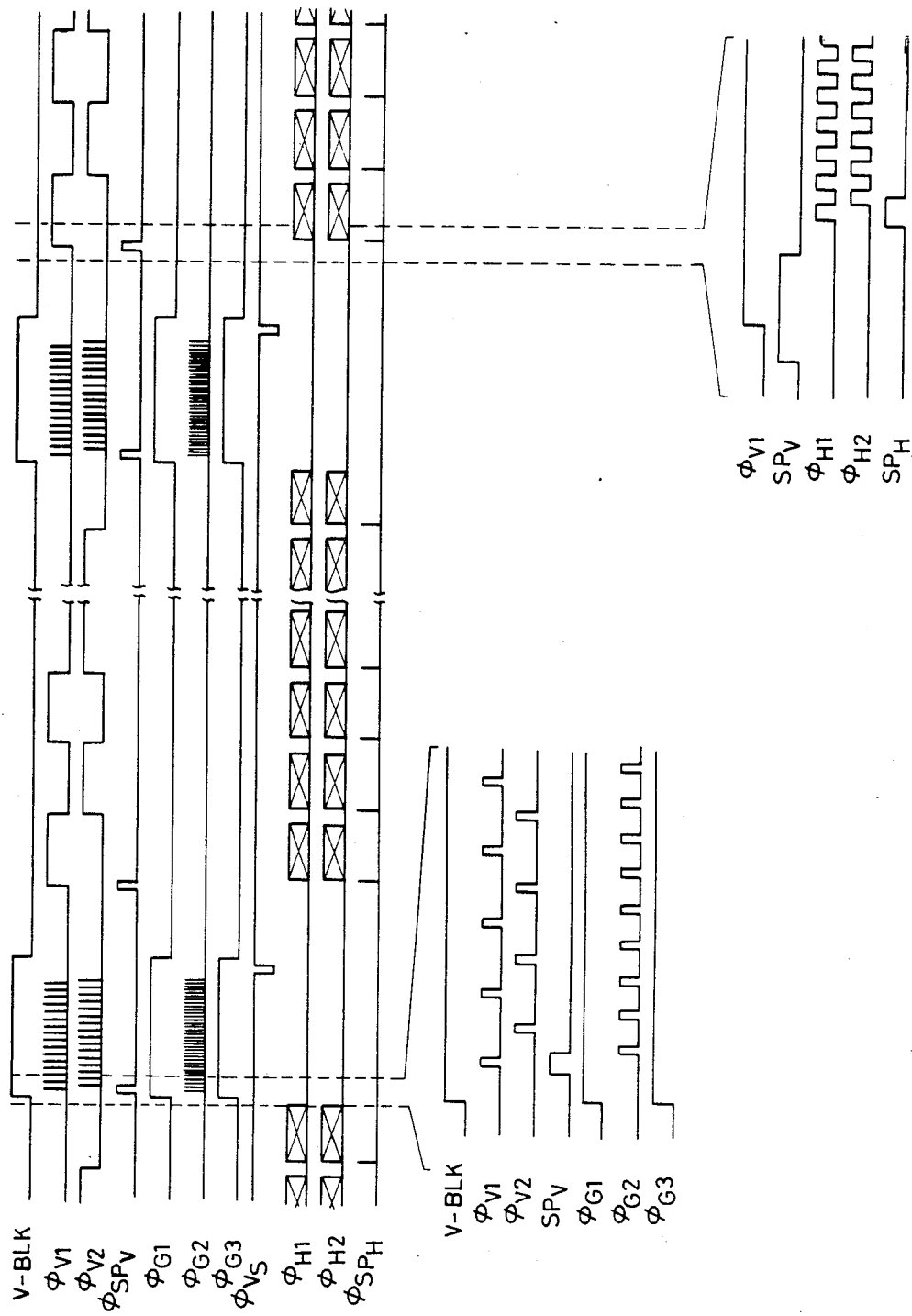

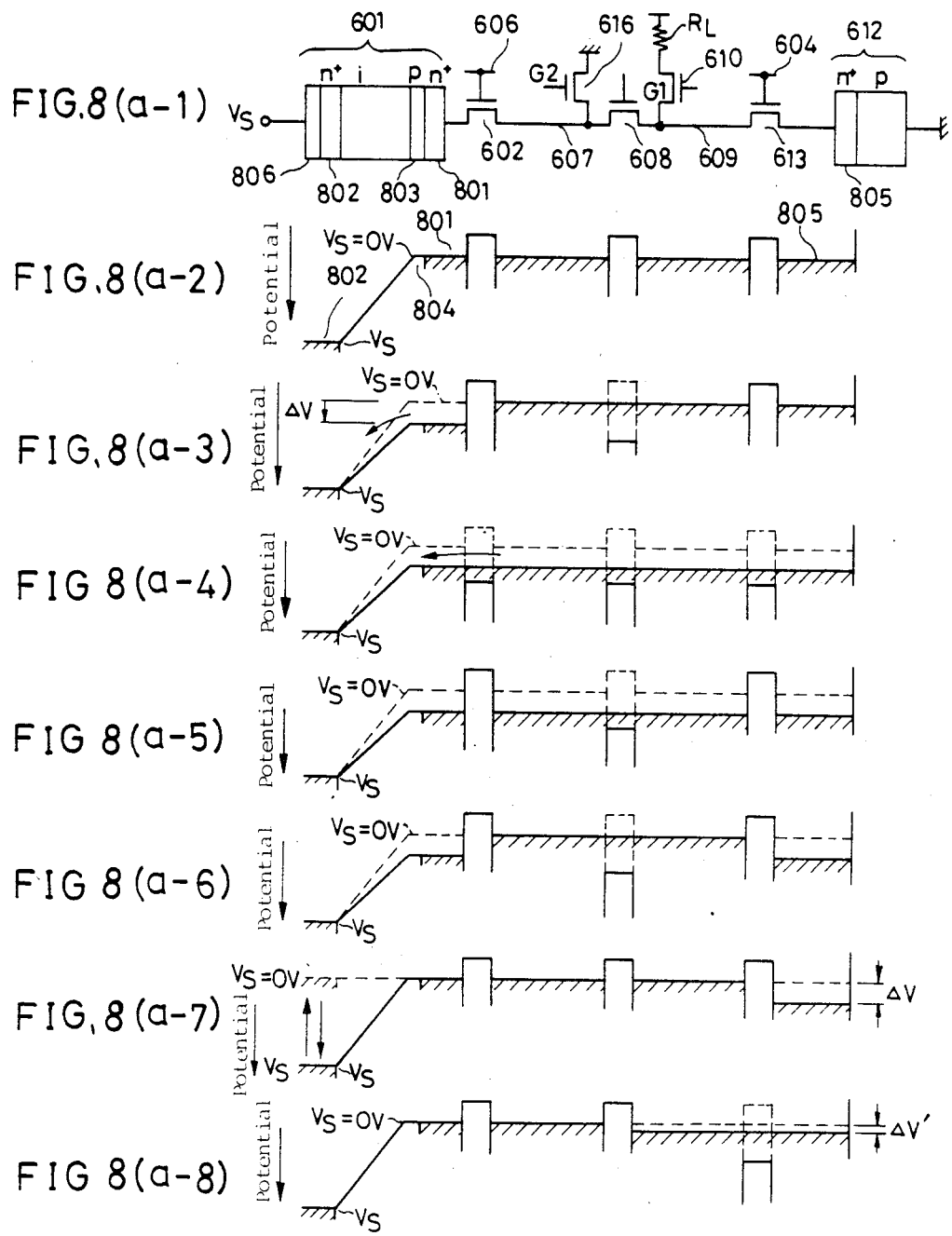

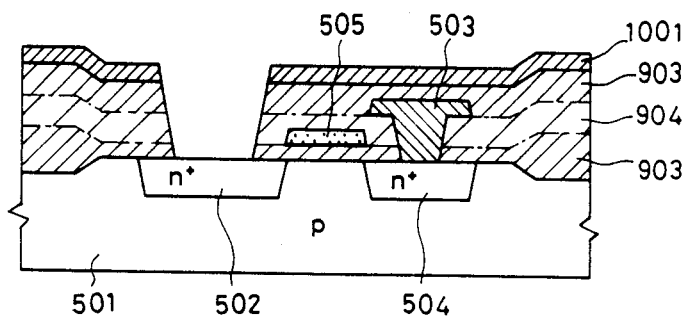
FIG.10(a-1)
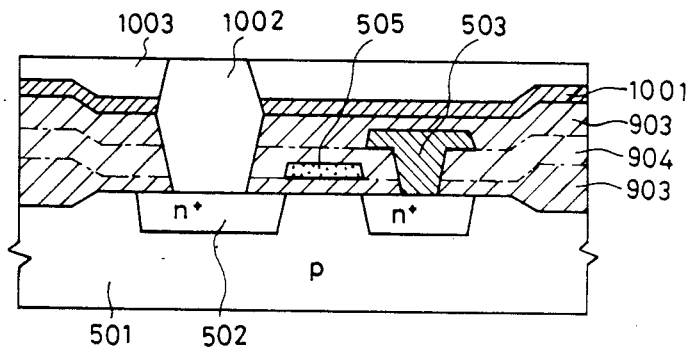
FIG.10(a-2)
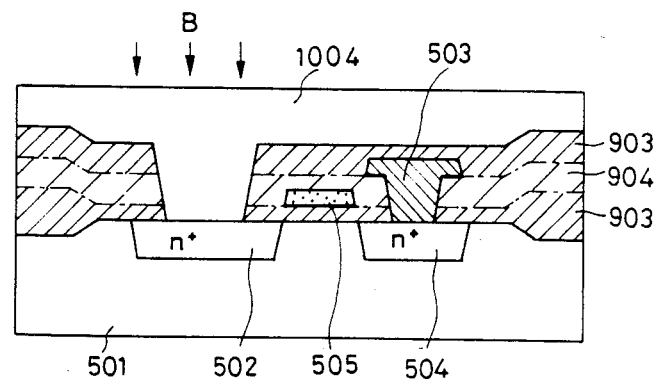
FIG.10(a-3)

SOLID STATE AREA IMAGING APPARATUS

BACKGROUND OF THE INVENTION

The present invention relates to a solid state area imaging apparatus which converts two-dimensional light information into an electric signal.

The typical conventional opto-electro function part of solid state area imaging device is a p-n photodiode or a MOS photodiode. Such opto-electro function part is of a charge accumulation type wherein carriers generated by the incident light are accumulated or stored in a depletion region which is in an electrically floating state, and thereafter the accumulated carriers are read out in sequence by scanning on the two-dimensional imaging device by a picture element selecting means and a signal readout means. The photo-sensitivity of such imaging device depends upon the aperture index of photo-detector.

For this reason, where a higher integration density such as smaller chip size, larger number of picture elements and the like of the imaging device is developed, it is unavoidable that the photo-sensitivity is reduced in proportion to the reduction in the aperture index of the photo-detector.

Furthermore, on the other hand, so far as the photo-electro function part is of a charge accumulation type, counter measures against blooming becomes indispensable because an excessive incident light causes a blooming effect.

In such circumstances, as a device structure enabling an increase in photo-sensitivity and elimination of blooming, solid state area imaging apparatuses have been proposed wherein a photo-conductive film, which is an insulator, is deposited on the surface of a semiconductor substrate. Opto-electro functionless and charge accumulation (or storing) parts of picture elements (p-n diode, etc.), picture element selecting means (scanning circuit, etc.), and a signal readout means [signal transport line, CCD (charge coupled device), etc.] are formed on the semiconductor. (For instance, Japanese Unexamined Patent Publication No. Sho 49-91116, Japanese Unexamined Patent Publication No. Sho 51-10715, Japanese Unexamined Patent Publication No. Sho 51-95720, Japanese Unexamined Patent Publication No. Sho 51-95721, etc.). However, the proposed apparatuses have many problems in performance, because the photo-conductive layer is constituted primarily with amorphous semiconductor and polycrystalline semiconductor, and also the perfectness (purity, precision of stoichiometry ratio, and crystalline perfectness) of these materials is inferior to single crystalline silicon.

In particular, in the case with amorphous semiconductor, there exists a problem of being subject to a change in characteristics because crystallization is likely to occur due to its thermal instability. And in the amorphous semiconductor, also exists a problem of extremely slow speed of response because the trap density in the bandgap is far larger in comparison to that of single crystalline silicon, resulting in a reduced mobility of carriers.

Furthermore, problems in the case with polycrystalline semiconductor are that the precision of grain size (normally about several μm) has an effect on reproducibility of characteristics at manufacture. That is, the grain size becomes about the same as the mean free path of electrons, and control of characteristics becomes difficult due to a change in band structure.

On the other hand, there are also proposals for carrying out countermeasures against blooming by increasing sensitivity by employing an opto-electro function part having an amplification function in the device rather than by increasing the sensitivity by improving the aperture index. In this proposed way, the opto-electro function is performed by means of depletion mode operation of majority carriers in the picture element part (For instance, Japanese Unexamined Patent Publication No. Sho 55-124259). The opto-electro function part in this case is a phototransistor of SIT (Static Induction Transistor: see IEEE Trans. Vol. ED-22, Nov. 4 (1975) pp. 185-197) type and has an intrinsic base or intrinsic gate in a potentially floating state, and therefore a switching function for resetting unrequired charges accumulated at that part (this corresponds to the minority carriers in the picture element part) is required. Accordingly, it is extremely difficult to realize the necessary number of picture elements (for instance, 200,000 picture elements are arranged in matrix on an imaging area of only about ⅔ inch diameter, horizontal 400 × vertical 500 = 200,000) as of the conventional solid state area imaging apparatus wherein design has been carried out by the rule of 2.5 to 3 μm.

SUMMARY OF THE INVENTION

Purpose of the present invention is to provide a solid state area imaging apparatus realizing a higher sensitivity by means of the amplification function of a SIT type phototransistor and increment in aperture index, and reliable counter-measures against blooming by means of the depletion mode operation of majority carriers. (In principle, blooming can be prevented by the depletion mode operation adopted in the present invention.) The present invention further realizes a higher integration of phototransistor which was assumed hardly possible so far. The high integration is attainable by constituting a phototransistor in three-dimensional construction by utilizing high resistivity layers which are formed, for instance, of single crystalline semiconductor of the same conductivity type as that of the semiconductor substrate on the surface part of the above-mentioned substrate whereon opto-electro functionless and charge accumulate picture elements parts, picture element selecting means, and signal readout means are formed, and also by providing a frame memory which temporarily stores signal information from the phototransistor at the same place.

BRIEF EXPLANATION OF THE DRAWING

FIG. 2(a) is a cross-sectional view of a solid state imaging device corresponding to the basic configuration of FIG. 1.

FIG. 2(b-1), FIG. 2(b-2), FIG. 2(b-3), FIG. 2(b-4), FIG. 2(b-5), FIG. 2(b-6) and FIG. 2(b-7) are potential model charts showing opto-electronic conversion of depletion mode operation of majority carriers and signal readout.

FIG. 3(a), FIG. 3(b), FIG. 3(c), FIG. 3(d), FIG. 3(e) and FIG. 3(f) show a first embodiment of an opto-electro function part in accordance with the present invention, FIG. 3(a) is a cross-sectional view, FIG. 3(b) is an equivalent circuit diagram, FIG. 3(c) is an energy band view at $V_S=0V$, FIG. 3(d) and FIG. 3(e) are energy band views at $V_S>0V$, and FIG. 3(f) is a sectional plan view of the device of FIG. 3(a) seen at the interface between the insulator region 306 and the substrate 301.

FIG. 4(a), FIG. 4(b), FIG. 4(c) and FIG. 4(d) show a second embodiment of an opto-electro function part in accordance with the present embodiment, and FIG. 4(a) is a cross-sectional view, FIG. 4(b) is an equivalent circuit diagram, FIG. 4(c) is an energy band view at $V_S=0V$, and FIG. 4(d) is an energy band view at $V_S>0V$ FIG. 5(a), FIG. 5(b), FIG. 5(b'), FIG. 5(c) and FIG. 5(d) show a third embodiment of an opto-electro function part in accordance with the present invention, and FIG. 5(a) is a cross-sectional view, FIG. 5(b) and FIG. 5(b') are equivalent circuit diagrams, FIG. 5(c) is an energy band view at $V_S=0V$, and FIG. 5(d) is an energy band view at $V_S>0V$.

FIG. 7 is a timing chart of driving pulses employed for the apparatus in FIG. 6.

FIG. 8(a-1) is an equivalent circuit diagram showing the operation of the apparatus in FIG. 6.

FIG. 8(a-2), FIG. 8(a-3), FIG. 8(a-4), FIG. 8(a-5), FIG. 8(a-6), FIG. 8(a-7) and FIG. 8(a-8) are potential model charts illustrating the operation of the apparatus in FIG. 6.

FIG. 10 is a cross-sectional view of a fifth embodiment of an opto-electro function part in accordance with the present invention.

FIG. 10(a-1), FIG. 10(a-2) and FIG. 10(a-3) are cross-sectional views showing steps of manufacturing process of the opto-electro function part in FIG. 10.

DESCRIPTION OF THE PREFERRED EMBODIMENTS

Figure 1:
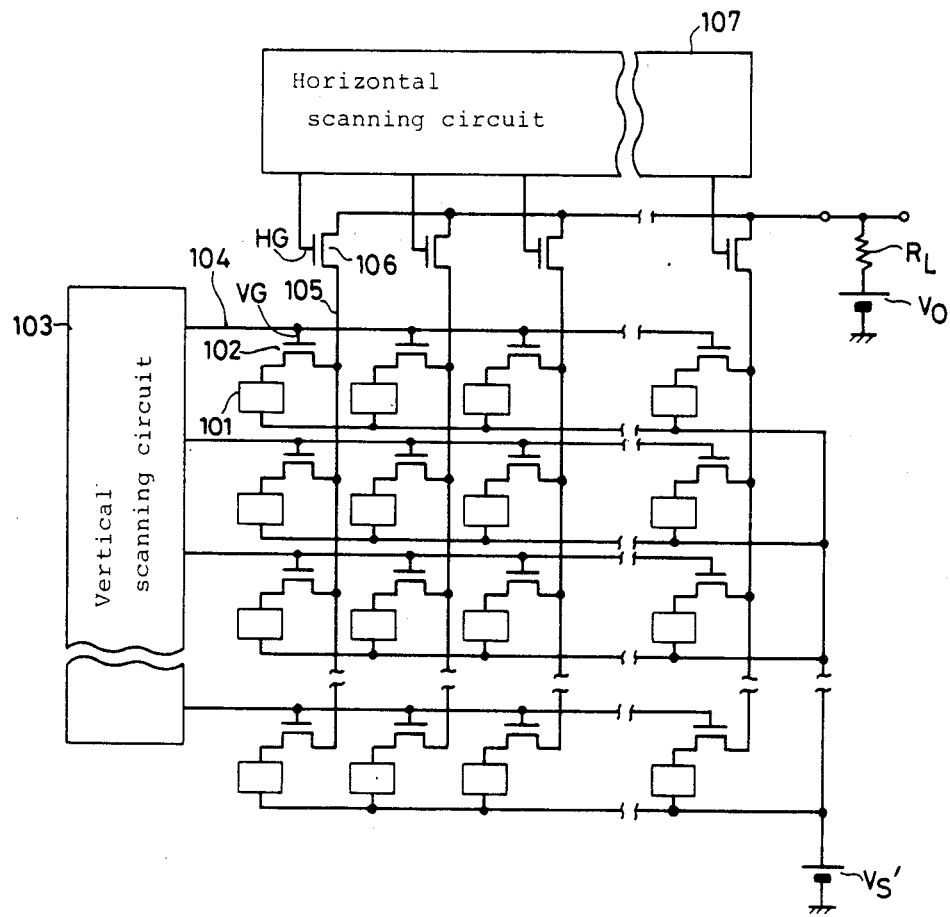
FIG. 1 shows a basic circuit configuration of a solid state area imaging apparatus in accordance with the present invention.

FIG. 1 shows a basic circuit configuration of an apparatus embodying the present invention. Here, an area imaging apparatus of X-Y address type is exemplified as a typical two-dimensional solid state area imaging system.

The X-Y address type area imaging apparatus comprises opto-electro function parts 101, vertical MOS switches 102 for selecting picture elements, a vertical shift register 103 as a vertical scanning circuit for scanning the vertical MOS switches 102 line by line, pulse transport lines (hereinafter referred to as row lines also) 104 for transmitting scanning pulses from the vertical shift register 103, signal transport lines (hereinafter referred to as column lines also) 105 for determining the potential at one side of the opto-electro function part 101 when each vertical MOS switch 102 is turned on, horizontal MOS switches 106 for setting the potential of each signal transport line 105 by means of an external power source $V_0$ (this may be $0V$), and a horizontal scanning register 107 as a horizontal scanning circuit for scanning the horizontal MOS switches 106 sequentially line by line. The potential of the signal transport line is set to the voltage of the external power source $V_0$ through a resistor $R_L$ for detecting a signal when the horizontal MOS switch 106 is turned on.

Furthermore, a power source $V_S$ is applied to the other side of the opto-electro function part 101 which is a high resistivity region to perform opto-electronic conversion by means of the depletion mode operation of majority carriers in the picture element part (this is a source region not connected to the signal transport line 105 of the horizontal MOS switch 102).

Next, details of the opto-electro functionless part wherein majority carriers make the depletion mode operation and method of the signal readout are elucidated in reference to FIG. 2(a) to FIG. 2(b-7).

In FIG. 2(a), an $n^+$-type region 202 on a p-type substrate 201 is an opto-electro functionless and charge accumulate picture element part connected to the opto-electro function part 101 as shown in FIG. 1, and this $n^+$-type region 202, an $n^+$-type region 203 and a gate VG constitute the vertical MOS switch 102 in FIG. 1.

The $n^+$-type region 203 is connected to a signal transport line 105 such as Al or the like. This signal transport line 105 is connected to an $n^+$-type region 205 which is a source of the horizontal MOS switch 106 of FIG. 1 formed by the source region 205, drain region 206 and the gate HG.

Furthermore, the $n^+$-type region 206 is grounded (thus $V_0=0V$) through a resistor $R_L$ for detecting signal charge across the resistor $R_L$.

FIG. 2(b-1), FIG. 2(b-2), FIG. 2(b-3), FIG. 2(b-4), FIG. 2(b-5), FIG. 2(b-6) and FIG. 2(b-7) are model charts showing potential states corresponding to the $n^+$-type region 202 which is the optoelectro functionless picture element region part for charge accumulation (or storing), the signal transport line and the external power source ($V_0=0V$). FIG. 2(b-1) is a potential model of the dark state. Pulses from shift registers 103 and 107 are applied to the gates VG of the vertical MOS switches and the gates HG of the horizontal MOS switches. Thereby each MOS switch being turned ON, and thereafter when the pulses disappear and each MOS switch is turned off, and thus all potentials other than those of the gates VG and HG are set to $0V$.

In FIG. 2(b-2), because of light irradiation, electrons which are majority carriers in nt region 202 are drawn out that is to say, depleted from the picture element part i.e. nt region 202 into the opto-electro function part 101 and their depletion mode operation is carried out. The potential of the $n^+$-type region 202 at this time depends upon the quantity of light irradiation. The signal readout method thereof is such that the gate VG is turned on to equilibrate the potentials of the $n+$ region 202 and the $n^+$-type region 205 as shown in FIG. 2(b-3), and when the gate HV is turned on with the state left intact as shown in FIG. 2(b-4), a signal current flows through the resistor $R_L$ by electrons injected from the ground (earth side of $R_L$) to return the electron depletion state to initial state, and a signal voltage is generated across the resistor $R_L$. Magnitude of this generated signal voltage is proportional to the quantity of depletion, i.e., quantity of light irradiation.

On completing signal readout, the gate HG is turned off as shown in FIG. 2(b-5), and subsequently the gate VG is turned off as shown in FIG. 2(b-6), and thus the potentials of all regions are set to the original $0V$ to be restored.

FIG. 2(b-7) is a model view of the potential corresponding to excessive incident light. In the n+-type region 202 which is a picture element part, the electron depletion phenomenon progresses extremely. However, when this depletion becomes equal to about or exceeds the breakdown voltage at the p-n junction of the device, electrons are replenished from the surrounding by a leakage current $i_l$, a dark current $i_d$ and the like. Therefore, no device is broken since a further destructive depletion is suppressed.

Figure 3F:
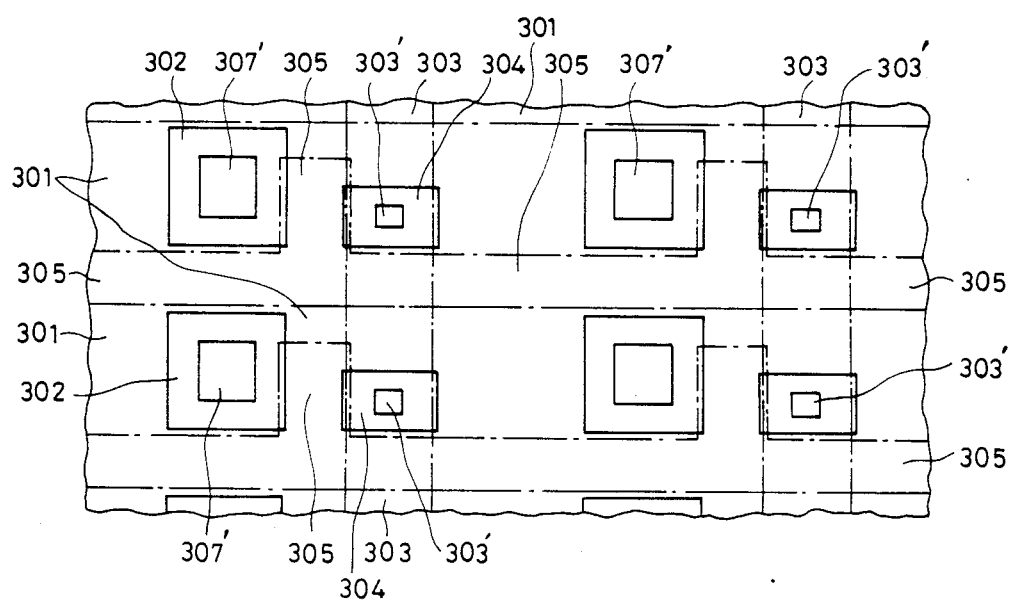

Next, elucidation is made on a concrete photoelectro function part. FIG. 3 shows a first embodiment of an opto-electro function part in accordance with the present invention.

FIG. 3(a) shows a cross-sectional structure of the vicinity of the opto-electro function part. On the surface of a p-type substrate 301, and n+-type region 302 (corresponds to n+ region 202 in FIG. 2(a)) which is a picture element part, an n+-type region 304 (corresponds to n+ region 203 in FIG. 2(a)) connected to a signal transport line 303, and a gate 305 corresponds to VG in FIG. 2(a)) are provided, and these constitute the vertical MOS switch 102 in FIG. 1. On an insulator region 306 of $SiO_2$ or the like substance, which protects the surface of the p-type substrate 301 and separates and insulates devices from each other, a high resistivity region 307 is formed, contacting with the n+-type region 302, and on this region 307 a transparent electrode 308 is formed, and $V_S$ is applied thereto.

Potential models at the cross-section Y-Y′ in FIG. 3(a) is the same as those in FIG. 2(a) to FIG. 2(b-7).

FIG. 3(b) shows an equivalent circuit diagram centered on the structure at the cross-section X-X′ in FIG. 3(a).

FIG. 3(c), FIG. 3(d) and FIG. 3(e) show energy band diagrams of the opto-electro function part according to the equivalent circuit diagram in FIG. 3(b).

FIG. 3(c) shows an energy band diagram in the thermal equilibrium state at $V_S=V_0=0V$ of the opto-electro function part when an intrinsic semiconductor is employed as the high resistivity region 307.

When a positive voltage is applied to the terminal $V_S$, an electric field is produced in the high resistivity region 307, and the energy band diagram of the opto-electro function part becomes as shown in FIG. 3(d).

When the impurity concentration of the high resistivity region 307 is zero or extremely low, by applying only a small voltage to $V_S$, the high resistivity region 307 is completely occupied by the depletion layer to produce a pinch off state, and a saddle-point-shaped potential barrier 309 in FIG. 3(d) appears in front of the n+-type region 302 which is a picture element part. The height of this potential barrier 309 primarily controls the flow rate of electrons flowing from the n+-type region 302 to the transparent electrode 308. This operation is similar to that of SIT. From the theory of operation of SIT, a series resistor rs of the high resistivity region 307 from the n+-type region 302 to the transparent electrode 308 must have the following relation with the equivalent transconductance Gm of the opto-electro function part including the high resistivity region 307 controlled by light incidence: rs·Gm>1.

To realize this condition, a semiconductor of n-type or p-type having an impurity concentration of about $10^{12}$-$10^{15}$ cm$^{-3}$ can be employed rather than an intrinsic semiconductor as the high resistivity region 307. In the energy band diagram in FIG. 3(d), when light enters into the high resistivity region 307, electron-hole pairs excited by the light are generated in the high resistivity region 307. Among them, electrons are absorbed in side of the transparent electrode 308, and holes are accelerated by a strong electric field applied to the high resistivity region 307, flow into the part 309 of potential barrier against electrons, and charge the potential barrier part 309 in positive polarity. This reduces the height of the potential barrier 309 against electrons to some extent as shown by the dash-dot line. As a result, electrons are injected into the high resistivity region 307 from the n+-type region 302, travel by means of drift electric field in the high resistivity region 307 and are absorbed into the transparent electrode 308. As a result, the n+-type region 302 becomes an electron-depleted state. The electron-depleted state herein is defined as a state that electrons as majority carriers decrease due to outflow, for instance, by opto-electronic conversion from a region having the majority carriers, and as a result, a region is changed in positive polarity. At this time, the carrier multiplying effect is produced by the function of the potential barrier 309 (See IEDM (1980) pp. 351-354).

The ratio of carrier multiplication $S_A$ is given by the ratio of a capacitance $C_S$ between the n+-type region 302 and ground to a capacitance $C_f$ between the potential barrier 309 part and the n+-type region 302.

$$S_A = C_S/C_f$$

Contact of the transparent electrode 308 with the high resistivity region 307 may be an ohmic contact, but as is obvious from FIG. 3(d), the blocking type contact against holes is more desirable for reducing a dark current.

FIG. 3(e) shows the state wherein the depletion mode of the n+-type picture element region 302 is in a further progressed state. The change in energy band designated by $\Delta V$ represents the quantity of electron-depletion by opto-electronic conversion reacting to the incident light.

Here, holes caught in the vicinity of the potential barrier 309 are in an accumulated state that is, these holes are stored in the high resistivity region 307 in front of the high resistivity region 307 in front of the n+ region 203. For this reason, the potential of the n+-type region 302 is determined by the height of the potential barrier 309 corresponding to the accumulated quantity of holes even when the signal readout is performed by the vertical MOS switch 102, so that electrons injected into the n+-type region 302 from the signal transport line 105 are quickly absorbed into the transparent electrode 308. Accordingly, the potential of the n+-type region 302 does not return to 0V and the potential before the readout by the vertical MOS switch 102 is maintained, therefore a non-destructive readout can be performed. On the other hand, in order to perform a usual destructive readout where the potential of the n+-type region 302 is reset to 0V, it is required to remove holes accumulated in the vicinity of the potential barrier 309. For this purpose, by setting the voltage $V_S$ to 0V or a negative voltage once, the holes caught in the vicinity of the potential barrier 309 can be ejected to the transparent electrode 308.

As mentioned above, in accordance with the present invention, no blooming is produced in principle as shown in FIG. 2 by carrying out the opto-electronic conversion in the depletion mode operation, and also the carrier multiplying effect, hence sensitivity multiplying is realized forming a potential barrier in the high resistivity region in the vicinity of the picture element region. Furthermore, the presence of this potential barrier enables the non-destructive readout, and it is found that the selection between the destructive readout and the non-destructive readout can be made only by changing voltage of the transparent electrode.

Furthermore, the high resistivity region, wherein the opto-electronic conversion is performed, can be formed by epitaxial process independent of the signal reading out device structure under the high resistivity region, and further more, all processes can be unified by known silicon processes. Therefore, it is understood that reproducibility and controllability are exceedingly good.

FIG. 4 shows a second embodiment of an opto-electro function part in accordance with the present invention.

FIG. 4(a) shows a cross-sectional structure of a vicinity of an opto-electro function part. On the surface of a p-type substrate 401, an n+-type region 402 (corresponds to n+ region 202 in FIG. 2(a)) which is a picture element region, an n+-type regions 404 (corresponds to n+ region 203 in FIG. 2(a)) connected to a signal transport line 403 and a gate 405 (corresponds to VG in FIG. 2(a)) constitutes the vertical MOS switch 102. On an insulator region 406 such as SiO$_2$ or the like which protects the surface of the p-type substrate 401 and separates and insulates devices from each other, a high resistivity region 407, being in contact with the n+-type region 402, is formed by epitaxial process. And on this region, a low resistivity n+-type region 408 is formed, and further on this region a transparent electrode 409 is formed.

FIG. 4(b) shows an equivalent circuit diagram centered on the structure of cross-section X—X' in FIG. 4(a). FIG. 4(c) and FIG. 4(d) show energy band diagrams of opto-electro function part according to the equivalent circuit diagram in FIG. 4(b).

In FIG. 4(b), an n+-type semiconductor is used as the low resistivity region 408, and an intrinsic semiconductor is used as the high resistivity region 407.

FIG. 4(c) shows an energy band diagram in thermal equilibrium state at $V_S = V_0 = 0V$ of the opto-electro function part as shown in FIG. 4(b).

When a positive voltage is applied to the terminal $V_S$, an electric field is produced in the high resistivity region, and an energy band diagram of the opto-electro function part at this time is as shown in FIG. 4(d).

When the impurity concentration of the high resistivity region 407 is zero or extremely low, by applying a small voltage to $V_S$ the high resistivity region 407 is completely covered with a depletion layer, and thus a pinch-off state is produced, and a saddle-point-shaped potential barrier 410 appears in front of the n+-type region 402 which is a picture element region. The height of this potential barrier 410 primarily controls the flow rate of electrons flowing from the n+-type region 402 to the transparent electrode 409. This operation is the same as that of SIT. From the theory of operation of SIT, a series resistor rs of the high resistance region 407 from the n+-type region 402 to the transparent electrode 409 must have the following relation with the equivalent transconductance Gm of the opto-electro function part including the high resistivity region 407 controlled by light incidence: $rs \cdot Gm < 1$. As far as this condition is met, a semiconductor of n-type or p-type having an impurity concentration of about $10^{12}$–$10^{15}$ cm$^{-3}$ can be also employed as the high resistivity region 407 rather than an instrinsic semiconductor.

In the energy band diagram in FIG. 4(d), when light enters into the high resistivity region 407, electron-hole pairs excited by the light are generated in the high resistivity region 407. Among them, electrons are absorbed into the transparent electrode 409, and holes are accelerated by a strong electric field applied to the high resistivity region, flow into the part 410 of potential barrier against electrons and charge the potential barrier part 410 in positive polarity. This reduces the height of the potential barrier 410 against electrons from the peak of solid line to the peak of chain line in FIG. 4(d). As a result, electrons are injected into the high resistivity region 407 from the n+-type region 402, travel by means of drift electric field, pass through the n+-type region 408, and absorbed into the transparent electrode 409. As a result, the n+-type region 402 becomes an electron-depleted state and a carrier multiplying effect is produced by the action of the potential barrier 410.

Furthermore, contact of the transparent electrode 409 with the n+-type low resistivity region 408 may be an ohmic contact, but as obvious from FIG. 4(d), the blocking type contact against holes is more desirable for reducing a dark current.

Here, holes caught in the vicinity of the potential barrier are in an accumulated state. For this reason, the potential of the n+-type region 402 is determined by the height of the potential barrier 410 corresponding to the accumulated quantity of holes even when the signal readout is performed through the vertical MOS switch 102. Therefore, electrons injected into the n+-type region 402 from the signal transport line 105 are quickly absorbed into the transparent electrode through the n+-type low resistivity region 408. Accordingly, no potential of the n+-type region 402 returns to 0V and the potential before the readout by the vertical MOS switch 102 can be maintained, and thus the non-destructive readout can be carried out.

On the other hand, in order to carry out a usual destructive readout when the potential of the n+-type region 402 is reset to 0V, it is required to remove the holes accumulated in the vicinity of the potential barrier 410.

For this purpose, by setting $V_S$ to 0V or a negative voltage once, the holes caught in the vicinity of the potential barrier 410 can be ejected to the transparent electrode 409.

In accordance with the above-mentioned second embodiment of the opto-electro function part, holes become not liable to be injected into the high resistivity region from the transparent electrode 409, since the low resistivity layer 408 is provided between the transparent electrode 409 and the high resistivity region 407. Accordingly, in comparison with the first embodiment of the opto-electro function part, the dark current becomes smaller, operation against temperature change becomes more reliable, and thus S/N and reliability are improved.

FIG. 5(a), FIG. 5(b), FIG. 5(b'), FIG. 5(c) and FIG. 5(d) show a third embodiment of the opto-electro function part of the present apparatus.

FIG. 5(a) shows an n+ipn+-type photo-detector. In this photo-detector, an n+ip part in an n+ipn+ structure is formed in a single crystalline part grown by epitaxial process on the surface of the substrate. Therefore, hereinafter this is referred to as laminated structure n+ipn+-type photo-detector.

As shown in FIG. 5(a), on the surface of a p-type substrate 501, an n+-type region 502 (corresponds to n+ region 202 in FIG. 2(a)) which is a picture element region, an n+-type region 504 (corresponds to n+ region 203 in FIG. 2(a)) connected to the signal transport line 105, and a gate electrode 505 (corresponds to VG in FIG. 2(a)) constitutes the MOS switch 102. And a p-type region 508, a high resistivity region (designated by i) 509 performing opto-electronic conversion, an n+-type region 510 are formed by epitaxial process and a transparent electrode 511 are laminated to contact with n+ region 510, and thus the n+ipn+-type photo-detector is constituted.

FIG. 5(b) shows an equivalent circuit corresponding to the cross-sectional view in FIG. 5(a). An n+ipn+-type phototransistor containing a transparent electrode 511 can be further expressed in a simplified form as shown in FIG. 5(b'), and is also referred to as a SIT type phototransistor (static induction transistor) 512.

Hereinafter, operation of the SIT type phototransistor 512 is elucidated in reference to FIG. 5(c) and FIG. 5(d) showing energy bands. Here, FIG. 5(c) corresponds to the state wherein the voltage $V_S$ of the transparent electrode is equal to the voltage of the signal transparent line $V_0$ and is 0V. FIG. 5(d) corresponds to the operational state when $V_S > 0$.

In FIG. 5(b), when the impurity concentration of the high resistivity region 509 is zero or extremely low, by applying a small voltage to the terminal $V_S$, the high resistivity i-type region 509 is completely occupied by the depletion layer to produce a pinch-off state. And in this state a saddle-point-shaped potential barrier 513 appears in front of the n+-type electrically floating region 502 which is a picture element region. The height of this potential barrier 513 primarily controls the flow rate of electrons flowing out of the n+-type electrically floating region 502.

In FIG. 5(b) and FIG. 5(d), when light enters into the high resistivity i-type region 509, electron-hole pairs are generated in this region 509. Among them, electrons are immediately absorbed into the n+-type region 510.

Holes are then accelerated by a strong electric field applied to the high resistivity i-type region 509 and flow into the p-type electrically floating region 508 to charge the p-type electrically floating region 508 in positive polarity. As a result, junction between the p-type electrically floating region 508 and the n+-type electrically floating region 502 is biased in the forward direction.

This reduces the height of the potential barrier 513 against electrons in the n+-type electrically floating region 502, as a result electrons travel by means of drift electric field from the n+-type electrically floating region 502 through the p-type electrically floating region (that is, beyond the potential barrier 513) and into the high resistivity i-type region 509, and then absorbed in the n+-type region 510. As a result, the n+-type electrically floating region 502 becomes an electron-depleted state. Also by setting the potential barrier 513 appropriately, the carrier multiplification is produced (refer to Tech. Dig. of 1980 IEDM pp 350–354). At this time, a smaller capacitance $C_f$ between the p-type electrically floating region 508 and n+-type region 502 as shown in FIG. 5(b) causes a larger change in voltage by a smaller inflow of holes, resulting in a better sensitivity. That is, when holes flow into the p electrically floating region 508, the potential of the p electrically floating region 508 changes to positive polarity. Since an electrically floating junction is formed between the p-type electrically floating region 508 and the n+-type electrically floating region 502, a built-in-potential must be retained between them as is well known. As a result, electrons must be ejected from the n+-type region 502 to the high resistivity region 509. In general, the capacitance of the n+-type region 502 is far greater than that between the p-type region 508 and n+-type region 502, therefore ($C_S/C_f$) electrons flow out from the n+-type electrically floating region 502 to the high resistivity region 509 corresponding to one hole flowing into the p-type electrically floating region 508. As a result, carrier multiplification is carried out.

Furthermore, the readout voltage is almost independent of the capacitance $C_B$ of the signal transport line 105. This reason is that when electrons flow into the n+-type electrically floating region 502 from the signal transport line 105 at signal readout, a positive voltage of the n+-type electrically floating region 502 drops at that instant, and as a result the forward bias of the junction between the p-type electrically floating region 508 and the n+-type electrically floating region 502 becomes deeper, and therefore electrons flowing into the n+-type electrically floating region 502 is immediately injected into the high resistivity i-type region 509.

Furthermore, contact of the transparent electrode 511 with the n+-type region 510 may be an ohmic contact, but as is obvious from FIG. 5(d), the blocking contact against holes is more desirable for reducing a dark current.

Furthermore, in FIG. 5(d), holes caught in the vicinity of the potential barrier 513 is in an accumulated state. Therefore, the potential of the n+-type electrically floating region 502 does not change, as far as holes in the p-type electrically floating region 508 are not lost due to recombination and the like since the potential of the n+-type electrically floating region 502 is determined by the height of the potential barrier 513 corresponding to the hole accumulation in the p-type electrically floating region 508. That is to say, the non-destructive readout becomes possible. Conversely, to set the potential of the n+-type region 502 to the initial set value $V_0$, holes in the p-type region 508 must be removed. The present apparatus, as is described later, employs a method wherein holes in the p-type electrically floating region 508 are ejected into the transparent electrode 511 by setting the applied voltage to the terminal $V_S$ to 0V or a negative voltage once.

Furthermore, to realize the above-mentioned operation, a series resistor rs of the high resistivity i-type region 509 from the n+-type electrically floating region 502 to the transparent electrode 511 must have the following reation with the equivalent transconductance Gm of the opto-electro function region including the high resistivity i-type region 509 controlled by light incidence: rs·Gm < 1. This condition can be realized by use of not only an intrinsic semiconductor but also an n−-type or p-type semiconductor having an impurity concentration of about $10^{12}$–$10^{15}$ cm$^{-3}$ as the high resistivity i-type region 509. In addition, an impurity concentration of about $10^{13}$–$10^{18}$ cm$^{-3}$ is preferably used for the p-type region 508.

Figure 6:
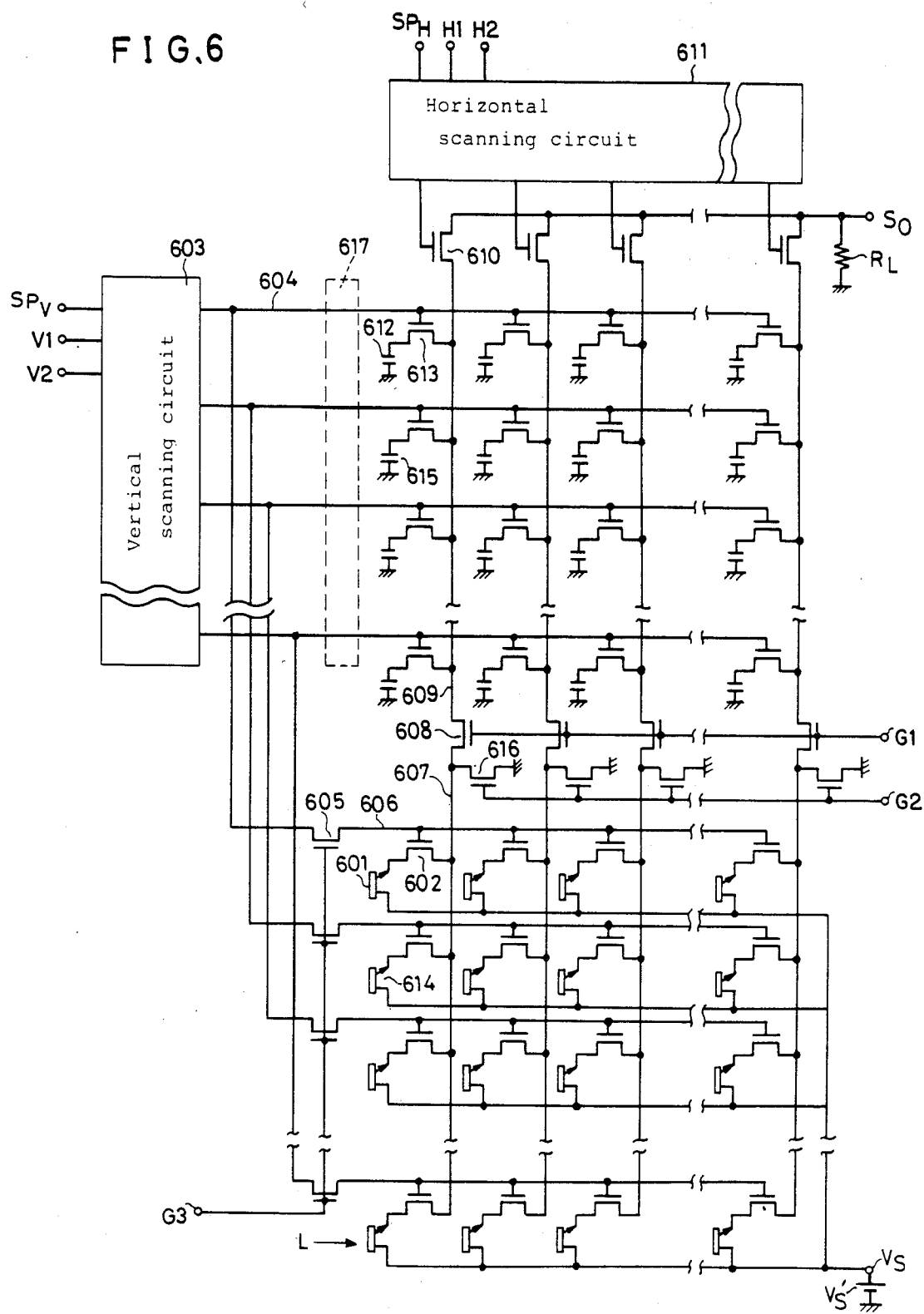
FIG. 6 is a circuit diagram showing an embodiment of a solid state area imaging apparatus in accordance with the present invention.

FIG. 6 shows an embodiment of a solid state area imaging device in accordance with the present invention employing an SIT-type phototransistor as shown in FIG. 5 as an imaging device.

The embodiment of FIG. 6 comprises: SIT type phototransistors 601 and 614 disposed in a two-dimensional pattern; vertical MOS switches 602 for selecting picture element; a vertical shift register 603 for controlling vertical MOS switches 602 of very horizontal line in sequence of lines to make vertical scanning; pulse transport lines 604 for transporting scanning pulses from the vertical shift register 603; pulse transport lines 606 connected through MOS switches 605 controlled by a signal given to a terminal G3; signal transport lines 607 for transporting the potential of the phototransistors 601 when each vertical MOS switch is turned on; signal transport lines 609 connected through the MOS switches 608 controlled by a signal given to a terminal G1; horizontal MOS switches 610 for setting the potential of each signal transport line 609 by means of the external power source $V_0$ (may be 0V); a horizontal scanning circuit 611 for scanning the horizontal MOS switches 610 sequentially; capacitors 612 and 615 for temporarily storing signal information of the SIT type phototransistors 601; vertical MOS switches 613 for transporting signal information of the capacitors 612 to the signal transport lines 609; and MOS switches 616 controlled by a signal given to a terminal G2 for refreshing the potentials of the signal transport lines 607 and 609. Furthermore, a voltage is applied to the phototransistors 601 from the terminal $V_S$ so as to make optoelectronic conversion by means of depletion mode operation of the picture element regions (this corresponds to the n+-type region 502 in FIG. 5(a)).

Hereinafter, operation of solid state area imaging device as shown in an embodiment of FIG. 6 is elucidated in reference to a timing chart of driving pulse in FIG. 7 and potential models in FIG. 8. (In FIG. 7, blocks with cross in the waveforms $\phi_{H1}$ and $\phi_{H2}$ represent very high frequency pulses.) Hereinafter, the voltage from the external power supply applied to a signal output terminal $S_0$ in FIG. 6 is assumed to be 0V.

Now, the phototransistor 601 in FIG. 6 receives an incident light, makes opto-electronic conversion by means of electron depletion mode operation, and ejects electrons in an n+-type electrically floating region 801 in FIG. 8(a-1) to an n+-type region 802. As a result, as is shown in FIG. 8(a-3), it is assumed that the n+-type region 801 becomes a depleted state and its potential rises by $\Delta V$ from the state in FIG. 8(a-2).

When turning into the vertical blanking interval (hereinafter referred to as V-BLK) in this state, voltage $\phi_{G1}$ at the becomes HIGH level and the MOS switch 608 is turned on. Furthermore, the vertical scanning circuit 603 operating by means of a start pulse $SP_V$ given to the input terminal $SP_V$ and clock pulses $\phi_{V1}$ and $\phi_{V2}$ given to the input terminals V1 and V2 make a high speed operation as shown by narrow pulses in the waveforms $\phi_{V1}$ and $\phi_{V2}$ in FIG. 7, thereby, the signal information of phototransistors 601 lining in the vertical direction in sequence is transported to the corresponding capacitors 612 for memory.

The above-mentioned vertical operation refers to an operation which shifts the shift register constituting the vertical scanning circuit by the number of vertical lines within a vertical blanking interval.

Concretely, since all the MOS switches 605 controlled by G3 are turned on during the V-BLK interval, pulses from the vertical scanning circuit 603 are applied simultaneously to the pulse transport lines 604 and 606. As a result, as is shown in FIG. 8(a-4), the vertical MOS switches 602 and 603 are turned on simultaneously. At this time, the potential of the n+-type electrically floating region 801 constituting a phototransistor drops by $\Delta V$ on account of the electron depletion mode operation, and also the value thereof is determined by a potential barrier 804 controlled by the holes accumulated in a p-type electrically floating region 803. Accordingly, as is shown in FIG. 8(a-4), electrons on the signal transport lines 607 and 609 are ejected to the n+-type region 802 overcoming the potential barrier 804, and the potentials of the vertical signal lines 607 and 609 and the potential of an n+-type region 805 of the capacitor 612 for memory agree with the n+-type electrically floating region 801 of the phototransistor 601.

Thereafter, the signal transport lines 607 and 609 which are left depleted are required to be refreshed before transporting signal information of another phototransistor 614 to the corresponding memory capacitor 615 by the subsequent timing of the signal $\phi_{V1}$. To execute this refreshing, as is shown in FIG. 8(a-5), electrons have only to be injected into the signal transport lines 607 and 609 by turning the terminal G2 to HIGH level to turn on the MOS switch 616 as shown in FIG. 8(a-6) after the vertical MOS switches 602 and 613 have been turned off as shown in FIG. 8(a-5).

Thus, the signal information of phototransistor is transported to the corresponding memory capacitor 615 one after another during the V-BLK interval.

Thereafter, by temporarily setting the voltage $V_S$ applied to a transparent electrode 806 to zero voltage (or a negative voltage) as shown in FIG. 8(a-7), potentials of the $n^{30}$-type electrically floating regions 801 of the phototransistors 601 of all the picture elements can be returned to the initially set levels to complete a refreshing of the phototransistors 601.

Next, when entering the vertical scanning period, the voltage $\phi_{G3}$ becomes 0V and the MOS switch 605 is turned off, therefore pulses from the vertical scanning circuit 603 are not transported to the pulse transport line 606 of the opto-electro conversion part, and are transported only to the pulse transport line 604 of the memory capacitor part.

Accordingly, signal information can be read out from the memory capacitor to exterior in the vertical scanning period.

To describe the operation more in detail, by applying pulses, (for instance, generated during the horizontal blanking interval of NTSC signal) from the vertical scanning circuit 603 making low speed operation based on the start pulse $\phi SP_V$ and the clock pulses $\phi_{V1}$ and $\phi_{V2}$ to the pulse transport line 604, the vertical MOS switch 613 is turned on as shown in FIG. 8(a-8). Therefore the depletion voltage $\Delta V$ (that is, signal voltage) of the depleted capacitor 612 becomes $\Delta V'$ by the capacity distribution of the vertical signal line 609 and the capacitor 612. $N_{Q-}$ which corresponds to amount of majority carrier decreased. But, if the number of depleted electrons are detected, no consideration is required to be given on such a change.

Furthermore, pulses from the vertical scanning circuit 603 maintain the pulse transport line 604 at "HIGH" level and simultaneously pulses are applied to the gates of the horizontal MOS switches 610 in sequence from the horizontal scanning circuit 611, thereby a making high speed operation is made based on a start pulse $\phi SP_H$ and clock pulses $\phi_{H1}$ and $\phi_{H2}$ (if the number of horizontal picture elements is about 400, about 7 MHz is used for the clock pulses $\phi_{H1}$ and $\phi_{H2}$).

At this time, the horizontal MOS switch 610 is turned on, and the number of electrons $N_Q = N_{Q-}$ corresponding to the number of depleted electrons $N_{Q-}$ distributed in the capacitor 612 and the signal transport line 609 are injected into the signal transport line 609 and the capacitor 612 through $R_L$. Accordingly, signal voltage caused by the number of flowing electrons $N_Q$ appears across an output load resistance $R_L$, and simultaneously the potentials of the capacitor 612 and the signal transport line 609 return to the initially set values as shown in FIG. 8(a-2).

By repeating such operations, signal information can be read out from all the capacitors for memory during the one vertical scanning period.

As mentioned above, according to the present invention, the following features, which are by no means obtainable with the conventional imaging devices, can be obtained by employing the SIT type phototransistors (601=502+508+509+510) for the opto-electronic conversion part and also by providing the frame memory parts (612, 615 . . . ) side by side in an integrated circuit:

(1) High sensitivity is realized by the large aperture index and the carrier multiplying effect.

(2) Refreshing of all the SIT type phototransistors of all picture elements can be controlled at the same time by the voltage $V_S$ applied to the transparent electrode.

(3) In addition, the SIT type phototransistors 601 are arranged in a three-dimensional structure, and also the frame memory parts 612 and 615 are introduced. These are of great advantage for realizing a higher density of picture elements in the imaging part.

(4) Since the SIT type phototransistor performs opto-electronic conversion by utilizing an electron-depleted state, there is no problem even the capacitance coupling between the phototransistor and the memory capacitor is large (accordingly, frame memory can be provided in the opto-electronic conversion part). And such a coupling has been realized only by the present invention.

(5) By inserting the field selecting circuit into the dot line frame part 617 in FIG. 6, the interlace readout or the two-line simultaneous readout can be arbitrarily controlled.

(6) A random access readout use can be realized by replacing the vertical scanning circuit 603 and the horizontal scanning circuit 611 in FIG. 6 by the vertical selecting circuit and the horizontal selecting circuit, respectively.

(7) During the refreshing of the above (2) is stopped, the non-destructive readout can be executed many times. Therefore by combining the above-mentioned random access readout in the foregoing item (6), an input imaging apparatus for a high degree of information processing such as, for instance, taking out a moving part of image only, emphasizing the contour of picture or the like, is realizable.

Furthermore, in the present invention, the SIT type phototransistors of three-dimensional structure are used in the opto-electro function part only. To further improve the above-mentioned performances, however, it is desirable to constitute all associated items other than the opto-electro function device with SIT's. In particular, when the SIT memory (See IEEE J or SSC Vol SC-13 No. J (1978) pp. 622-634)) is used for the memory part, area required for the memory part can be small due to its longitudinal structure.

Here, the opto-electro function part as shown in FIG. 5 can also be modified into a more preferable structure.

Figure 9A:
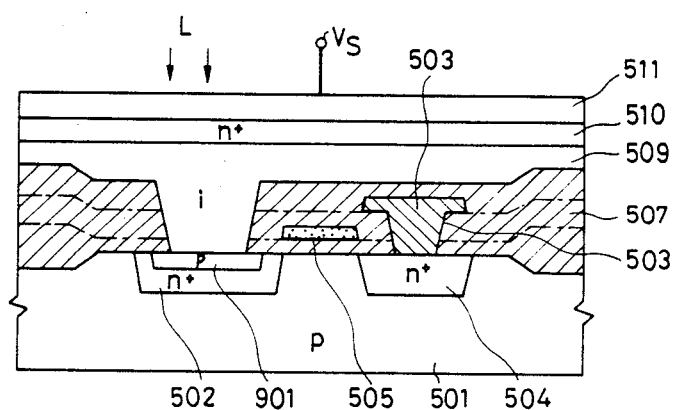
FIG. 9 is a cross-sectional view of a fourth embodiment of an opto-electro function part in accordance with the present invention.

FIG. 9(a) is a modification of FIG. 5(a). Instead of FIG. 5(a), where the p-type region 508 is formed on the surface of the n+-type region 502, in FIG. 9(a). By such structure the epitaxial formation of the high resistivity i-type region 509 becomes easier. Furthermore, since the structure enables the formation of potential barrier of phototransistor part in the p-type region 901 inside the n+-type region 502, effects of the high resistivity i-type region 509 and the interface of the phototransistor are included in the drift travel section. And thereby operation of the potential barrier is more stabilized.

Figure 9B:
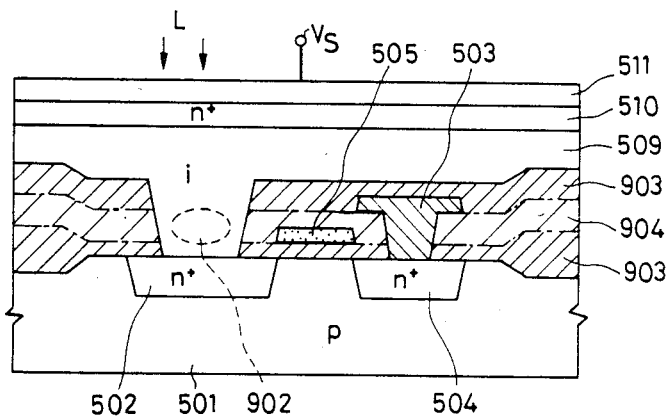

FIG. 9(b) shows another embodiment in accordance with the present invention which is preferable as a phototransistor (hereinafter referred to as n+-i-n+-type phototransistor).

In this example, instead of the p-type region as applied in the previous example of FIG. 9(a), potential barrier for the phototransistor is formed by using insulator regions 903 and 904 comprising different dielectric constants (by selecting the dielectric constant of 903 is greater than that of 904, or by injecting impurity ions into the insulator region 904). Thereby the potential barrier in a range 902 surrounded by the insulator region 904 is formed.

Intrinsically, the potential barrier is produced even if the dielectric constants of the insulator regions 903 and 904 are equal in FIG. 9(b), but the producing of the difference is for assuring the formation of the more reliable or stable potential barrier.

Here, the structure in FIG. 9(b) is simplest as an opto-electro function part in accordance with the present invention. The performance of the present invention depends greatly upon whether or not the high resistivity i-type region 509 can be formed smoothly on the surface of the n+-type region 902 in a form of a perfect Si single crystal without no defects.

Hereinafter, a typical process for manufacturing an opto-electro function part of the present device to the satisfaction of such conditions are elucidated in reference to FIG. 10(a-1), FIG. 10(a-2) and FIG. 10(a-3).

That is to say, as is shown in FIG. 10(a-1), the n+-type region 502 and the n+-type region 504 are formed on the surface of the p substrate 501 by means of diffusion or ion-implantation. Thereafter, the surface is oxidized thermally to form the first insulator region 903 (less than 1000 Å thick) of such as $SiO_2$ or the like. Subsequently, a gate electrode 505 is formed with polycrystalline silicon, and thereafter the surface is thermally oxidized to form the second insulator region 904. And then this region 904 changes p+-type region by means of ion-implantation or the like.

Next, a window for contact is formed and a signal transport line 503 is formed with aluminum or the like, and brought in contact with the n+-type region 504. Thereafter the surface is thermally oxidized again to form the third insulator region 903. On this region, a CVD polycrystalline silicon 1001 is formed (in less than 1000 Å thickness), and then a window for contact is formed on the n+-type region 502.

Next, as is shown in FIG. 10(a-2), by growing an epitaxial layer, a single crystalline silicon 1002 is grown on the n+-type region 502, and a polycrystalline silicon 1003 is grown uniformly on the CVD polycrystalline silicon 1001. The interface between the n+-type region 502 and the single crystalline silicon 1002 which is formed by this growing an epitaxial is clean, and since an interface trap state does not exist, a characteristic of response does not get worse. (This is referred to as simultaneous growth of silicon-polycrystalline silicon.)

Subsequently, as is shown in FIG. 10(a-3), by irradiating laser beam or energy beam from above, the polycrystalline silicon regions 1001 and 1003 are changed into single crystalline silicon by using the single crystalline silicon region 1002 as a nucleus. And thus a high resistivity region 1004 of single crystalline silicon is formed all over the surface of the insulator region 903.

Thereafter, by forming the n+-type region and the transparent electrode in sequence on the surface, a phototransistor structure as shown in FIG. 10 is completed.

As mentioned above, the opto-electro function part employed in embodiments of the solid state area imaging device in accordance with the present invention can be made considerably with a high integration by means of three-dimensional structure. According to the above-mentioned manufacturing method, it is possible that an epitaxial of an opto-electro functions part is formed on a conventional photo diode or on an accumulation diode of a memory without introduction of an interface trap state. But the circuit configuration as shown in FIG. 6 still has a problem of requiring large area, since the opto-electro function part and switching part are disposed side by side on the same surface.

This occupation area can be made smaller to a great extent by employing the SIT of vertical structure, that is, a circuit configuration fully utilizing a three-dimensional structure. Such embodiment is elucidated in reference to FIG. 11 and FIG. 12.

Figure 11:
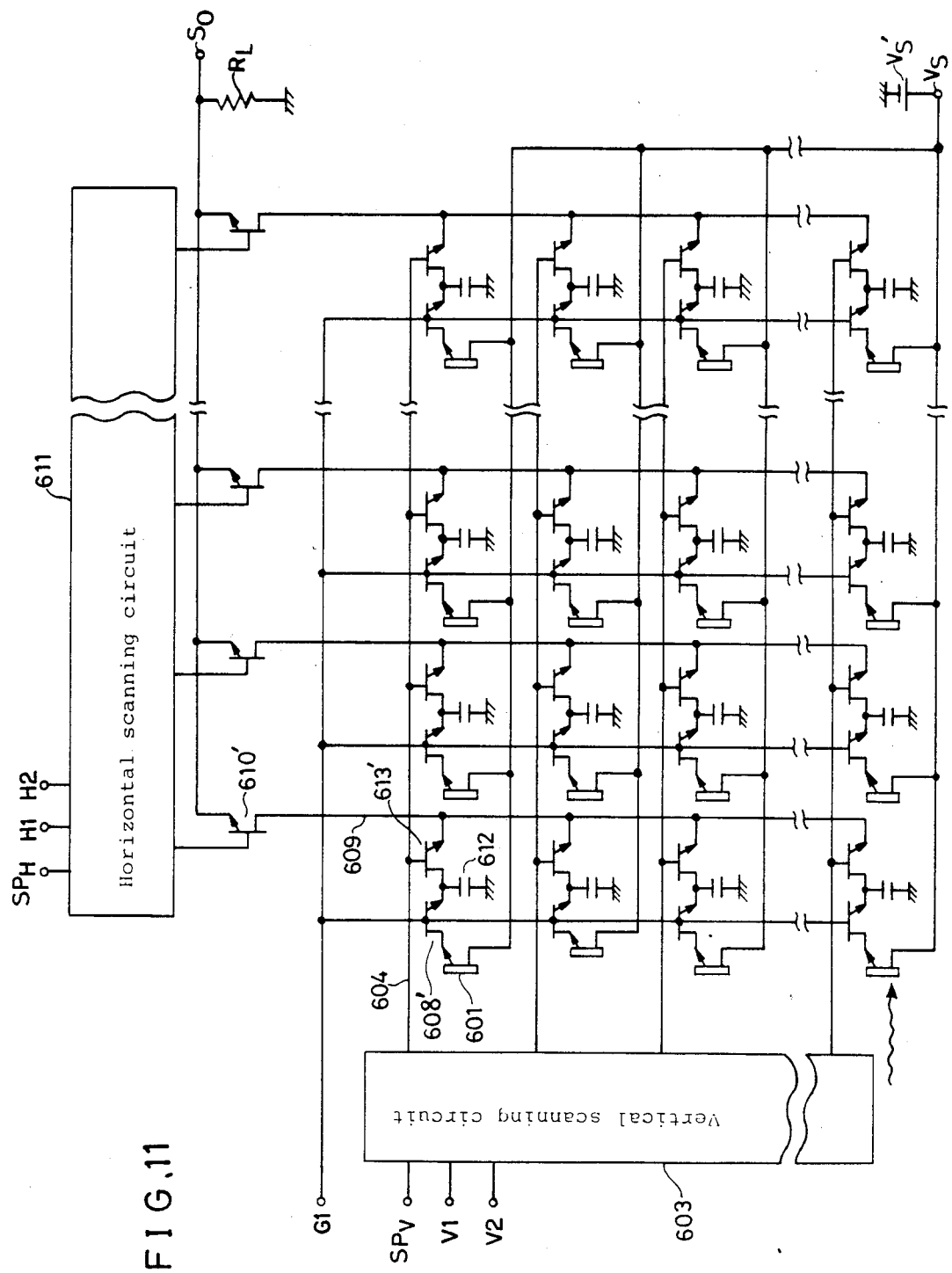
FIG. 11 shows a second embodiment of a solid state area imaging apparatus in accordance with the present invention.
Figure 12A:
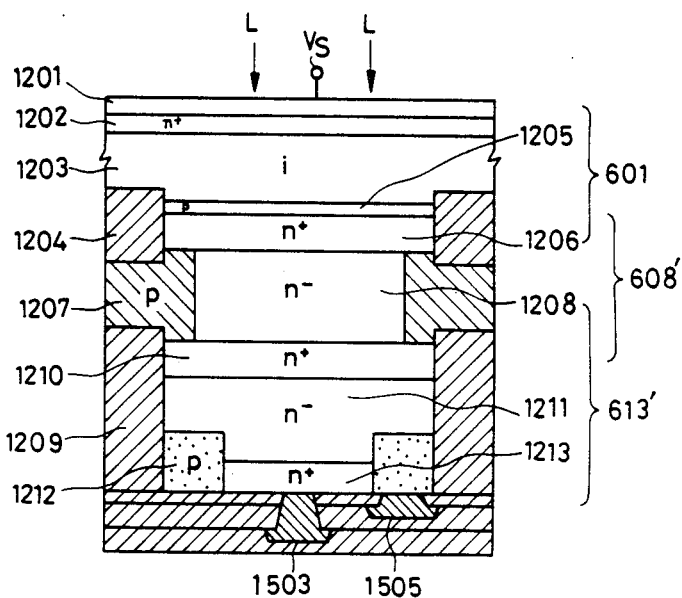
FIG. 12(a) and FIG. 12(b) are a cross-sectional structure view and a plan view of unit picture element of solid state imaging device in FIG. 11, respectively.
Figure 12B:
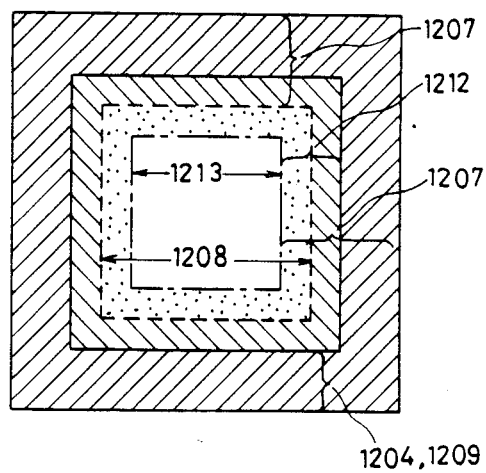

Basic differences in configuration between the embodiment shown by FIG. 11 to FIG. 12(b) and the foregoing embodiments of the solid state area imaging devices shown in FIG. 1 to FIG. 10 are that, in the example of FIG. 11 to FIG. 12(b), the vertical MOS switches for selecting signal information of the SIT type phototransistors 601 can be dispensed with and accordingly the high speed operation of the vertical scanning circuit 603 for during the V-BLK interval can be dispensed with and the MOS switches 616 controlled by the terminal G2 can be dispensed with because of simultaneous resetting of the vertical signal lines.

Further, differences are that because of the SIT configuration of all the devices, MOS switches 613 for reading out signal information of capacitors 612 are replaced by SIT switches 613', and also MOS switches 610 controlled by pulses from the horizontal scanning circuit 611 to reset the capacitors 612 and the signal transport lines 609 are replaced by SIT switches 610'.

Furthermore, the MOS switches 608 controlled by the terminal G1 are replaced by SIT switches 608' for transporting signal information directly to the capacitors 612 from the phototransistors 601. As a result, the signal $\phi_{G1}$ becomes "HIGH" level during the V-BLK interval, and all the SIT switches 608' are turned on, and then transport of signal information is completed making the corresponding capacitors 612 into electron-depleted state induced by electron-depleted states of all the phototransistors 601. A method of reading out signals from the capacitors 612 to the output thereafter is performed in the same manner as in FIG. 6.

As mentioned above, the embodiment of the solid state area imaging device of FIG. 11 simplifies not only the circuit configuration but also the operation itself. FIG. 12(a) and FIG. 12(b) show a cross-sectional structure of one example of one bit part of picture element of the embodiment of FIG. 11.

FIG. 12(a) shows a cross-sectional structure and FIG. 12(b) shows a plan view. According to FIG. 12(a), a transparent electrode 1201, an n+-type region 1202 and a high resistivity i-type region 1203 are formed in sequence from below. On the high resistivity i-type region 1203, a p-type region 1205 and an n+-type region 1206 are formed surrounded by an insulator region 1204 which separates and insulates picture elements from each other (the above-mentioned is an opto-electro function part corresponding to the structure as shown in FIG. 5, and is the n+pin+-type phototransistor 601 also). A p-type region 1207 which serves as a gate of the SIT switch 613' is formed on the insulator region 1204, and an n−-type region 1208 is formed on the n+-type region 1206, respectively. Furthermore, on these regions, an n+-type region 1210 and an n−-type region 1211 surrounded by an insulator region 1209 are formed in sequence, and on the surface of the n−-type region 1211, an n+-type region 1213 surrounded by a p-type region 1212 acting as a gate is formed. Among them, the n+-type region 1206-the n−-type region 1208-the n+-type region 1210-the p-type region 1207 constitute the SIT switch 608' controlled by the signal $\phi_{G1}$, and the n+-type region 1210-the n−-type region 1211-the n+-type region 1213-the p-type region 1212 constitute the SIT switch 613'.

According to the above-mentioned embodiment is FIG. 11–FIG. 12(b) of the solid state area imaging device, the following features can be added to the aforementioned features (1) to (7) of previous examples.

(7) A higher integration and a simpler driving system can be realized by adopting a thorough three-dimensional structure.

(9) Because signal information of all phototransistors can be transported simultaneously to the corresponding memories, a function as an ideal electronic shutter of still camera can be realized (in this case, the time of "HIGH" level of $V_S$ corresponds to the shutter opening time).

Furthermore, by using the SIT switches, the features of high sensitivity and no generation of blooming are provided, and furthermore the non-destructive readout and the random access can be easily performed. Therefore an image information processing function can be provided also.

Accordingly, by making use of the present invention, a wide range of applications can be considered as TV cameras, electronic still cameras, photo-sensors for information processing and the like.

In the above-mentioned embodiments, the n channel MOS and the n channel SIT have been used. But p-type channel MOS and p-type channel SIT can also be used instead.

Furthermore, for the substrate material, compound semiconductor such as GaAs or the like, needless to say, can be used in place of Si.

What is claimed is:

1. A solid state area imaging apparatus comprising:
a semiconductor substrate of a first conductivity type,
a plurality of picture element regions which are of a second conductivity type opposite to said first conductivity type and of a high impurity concentration and disposed in a two-dimensional pattern on a principal face of said semiconductor substrate,
selection means formed on said semiconductor substrate with close proximity to respective ones of said picture element regions for selecting desired ones of said picture element regions,
signal readout means formed on said semiconductor substrate for reading out electric signal of said selected desired ones produced by radiations incident thereon responding to said selection,
the above-mentioned parts forming an integrated circuit, and a high resistivity region which is formed by epitaxial growth on said substrate and connected to said picture element regions for opto-electronic conversion function to utilize both the holes and electrons, and a transparent electrode formed on said high resistivity region, the above-mentioned parts and said picture element regions forming photo-transistors, voltage impressing means for impressing a voltage on said transparent electrode to bias said high resistivity region to produce depletion mode operation of majority carriers in said picture element regions.

2. A solid state area imaging apparatus in accordance with claim 1, wherein said high resistivity region and said transparent electrode forming a blocking type contact against minority carriers with said picture element regions.

3. A solid state area imaging apparatus in accordance with claim 1, which further comprises a low resistivity region, which has a high impurity concentration, is of said second conductivity type and forms a blocking type contact against minority carriers with said transparent electrode, is provided between said high resistivity region and said transparent electrode.

4. A solid state area imaging apparatus in accordance with claim 1, wherein said high resistivity region is an intrinsic region.

5. A solid state area imaging apparatus in accordance with claim 1, wherein said high resistivity region is of a low impurity concentration of said second conductivity type.

6. A solid state area imaging apparatus in accordance with claim 1, wherein said high resistivity region is of a low impurity concentration of said first conductivity type.

7. A solid state area imaging apparatus in accordance with claim 1, wherein said high resistivity region comprises a first part of a low impurity concentration and a second part of an intrinsic region.

8. A solid state area imaging apparatus in accordance with claim 7, wherein said first part are separated by insulating regions and are disposed in twodimensional pattern corresponding to said plurality of picture element parts.

9. A solid state area imaging apparatus in accordance with claim 1, wherein second high resistivity region of low impurity concentration and of said first conductivity type are formed on the surface of said picture element region, in a manner that said second high resistivity regions respectively contacts said high resistivity region.

10. A solid state area imaging apparatus in accordance with claim 1, wherein said high resistivity region comprises regions of a saddle-point-shaped potential barrier part at proximity of a picture element region in a main operating region, series resistance rs between said picture element region and said potential barrier and intrinsic transconductance Gm hold a relation rs·Gm<1, thereby to make accumulation mode operations of minority carriers of said picture elements in said potential barrier part.

11. A solid state area imaging apparatus in accordance with claim 7, wherein said potential barrier part is formed in said second part of intrinisc regions and series resistance rs between said picture element region and said potential barrier and intrinsic transconductance Gm hold a relation rs·Gm<1, thereby to make accumulation mode operations of minority carriers of said picture elements in said potential barrier part.

12. A solid state area imaging apparatus in accordance with claim 9, wherein said potential barrier part is formed in said second high resistivity regions and series resistance rs between said picture element except said second high resistivity region and said potential barrier part and intrinsic transconductance Gm hold a relation rs·Gm<1, thereby to make accumulation mode operations of minority carriers of said picture element excluding said second high resistivity region in said potential barrier part.

13. A solid state area imaging apparatus in accordance with claim 10, wherein signal reading is made in nondestructive manner by means of said accumulation mode operations of minority carriers in said potential barrier part.

14. A solid state area imaging apparatus in accordance with claim 1, wherein said selection means are one selected from the group consisting of MOS transistors or charge transfer gates.

15. A solid state area imaging apparatus in accordance with claim 1, wherein said high resistivity region is of a single crystalline of substantially the same as that of said substrate.

16. A solid state area imaging apparatus in accordance with claim 1 wherein said signal read means further comprises:

capacitors for frame memory disposed in the two-dimensional pattern corresponding to that of said phototransistors for temporary storings of signal charges in said phototransistors, signal transporting lines connecting said phototransistors and said capacitors.

17. A solid state area imaging apparatus in accordance with claim 16, wherein said signal transporting means further comprises:

first switching means for selecting said phototransistors, and second switching means for selecting said capacitors, said signal transport lines connecting said first switching means and said second switching means therewith, said first switching means and said second switching means being to be turned on and off every horizontal scannings.

18. A solid state area imaging apparatus in accordance with claim 1, wherein said signal read means comprises:

capacitors for frame memory disposed in the two-dimensional pattern corresponding to that of said phototransistors, for temporary storings of signal changes in said photo-transistors, a plurality of switching means connected between said phototransistors and capacitors, said switching means turned on and off simultaneously with every horizontal scanning.

19. A solid state area imaging apparatus in accordance with claim 17, wherein said switchings means are disposed immediately under said picture element regions.

* * * * *